Aug. 19, 1969 B. ROSS 3,462,311

SEMICONDUCTOR DEVICE HAVING IMPROVED RESISTANCE TO RADIATION DAMAGE

Original Filed April 23, 1962

BERND ROSS
*INVENTOR.*

BY [signature]

ATTORNEY.

United States Patent Office
3,462,311
Patented Aug. 19, 1969

3,462,311

SEMICONDUCTOR DEVICE HAVING IMPROVED RESISTANCE TO RADIATION DAMAGE

Bernd Ross, Arcadia, Calif., assignor, by mesne assignments, to Globe-Union Inc., Milwaukee, Wis., a corporation of Delaware Continuation of application Ser. No. 189,509, Apr. 23, 1962. This application May 20, 1966, Ser. No. 551,805
Int. Cl. H01l 15/02
U.S. Cl. 136—89 3 Claims

ABSTRACT OF THE DISCLOSURE

A semiconductor device having a drift field therein for increasing minority carrier diffusion length. The drift field is established either in an epitaxially grown region or in the bulk by diffusion of lithium. This presence of the drift field and/or the lithium makes a photovoltaic solar cell especially resistant to radiation damage.

This is a continuation of application Ser. No. 189,509, filed Apr. 23, 1962.

This invention pertains to solar cells of the P-N semiconductor junction type, and has for its main object the provision of such cells which are relatively immune to the degradation which ordinarily accompanies their exposure to bombardment by nuclear radiation or particles.

Known solar or photovoltaic cells consist generally of a substrate of a semiconductor such as silicon in monocrystalline form and of one conductivity type having a very thin surface layer of a different conductivity type. In the typical case, for example, the substrate or bulk material may be silicon of N-type having a thickness of from 10 to 20 mils to give adequate strength and ruggedness for cells having an exposed surface area of from 1 to 2 square centimeters. One surface is then diffused with an acceptor impurity such as boron to a depth of about 0.5 to 1 micron, the layer being sufficiently thin as to permit a high percentage of any incident light to penetrate close to the P-N junction region so produced.

It is well known that the efficiency of such solar cells is adversely affected by bombardment with nuclear reaction products (alpha, beta and gamma radiation, and neutrons). In the typical configuration described above by way of example, the main degradation source is the reduction in minority carrier diffusion length in the bulk (N-type) material, or what amounts to the same thing, the increase in recombination rate therein caused by the creation of recombination centers. While one might expect that exponential absorption of particles or radiation in the thin P-type layer would be a major source of degradation, the fact is that carrier transport in that region is mainly determined by drift in the high-field region which results from the impurity concentration gradient.

It would appear that the degradation described above could be reduced by providing the bulk material with a concentration gradient (directionally opposed to that of the surface P-layer). For reasons of mechanical strength, however, the substrate must be relatively thick, and the production of the desired gradient close to the P-N junction could not be achieved by diffusion from a crystal surface more than approximately 5 mils away from the junction. This is because of the physical nature of the process of impurity diffusion, which requires a decreasing concentration gradient with distance from the diffusion source.

The invention provides two distinct methods by which solar cells can be rendered relatively immune to bombardment-induced degradation caused by nuclear radiation; both methods ultimately operating by the practical production of an impurity concentration gradient in the bulk material, opposite in "sense" or direction to the gradient in the surface zone, so that collection on both sides of the P-N junction is by drift. The invention also comprehends the novel products of these methods.

Briefly, the first method involves production of the "active" thin surface layer in the bulk material by the known diffusion technique, followed by the diffusion into the opposite surface of an impurity of opposite conductivity-type inducing character, under the influence of an electric field to allow positioning of these atoms by drift, rather than diffusion, at a relatively low temperature. The thermal motion of the impurity ions which is superimposed upon the drift furnishes the desired impurity concentration gradient. A second method utilizes the phenomenon of epitaxial growth to provide, in effect, a relatively thin intermediate and high-resistivity layer between the P-N junction and the rugged thicker substrate; in which intermediate layer the desired "opposite" concentration gradient can relatively easily be formed by diffusion of the majority impurity from the substrate into the back side of the epitaxial layer. In this case, the main bulk of the substrate is of extremely low resistivity, so that the high impurity concentration implied by the low resistivity furnishes an effective source for diffusion. The P-N junction is formed within the high-resistivity epitaxial layer in the plane where the diffusion concentration curves intersect, or in other words, where the concentrations of the oppositely charged impurity atoms are equal.

The invention will best be understood by referring to the following detailed specification thereof, taken in connection with the appended drawing, in which.

Figure 1:
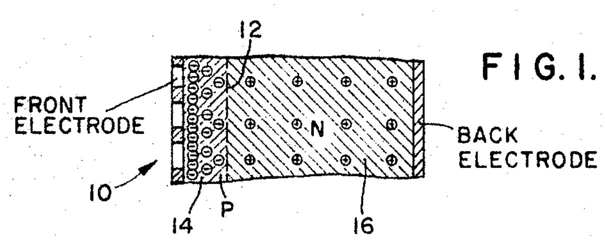
FIG. 1 is a sectional view of a conventional solar cell, indicating the relation of its parts for purposes of explanation.

FIGURE 1 illustrates in schematic section (and to a greatly exaggerated thickness scale) a typical solar cell 10 of the silicon P-on-N type. The P-N junction level is indicated at 12, between the thin surface P-layer 14 and the much thicker N-type monocrystalline bulk material 16. The P-layer 14 is typically formed by diffusion of an acceptor impurity (such as boron) into the adjacent surface, giving rise to the concentration gradient as shown by the circles marked with minus signs. In a solar cell of the N-on-P type, a donor impurity (such as phosphorus) would be similarly diffused into monocrystalline P-type bulk material. The lack of any concentration gradient in the undiffused bulk material is apparent, and is indicated by the evenly distributed circles marked with plus signs.

FIRST PROCESS EMBODIMENT

Figures 2, 3:
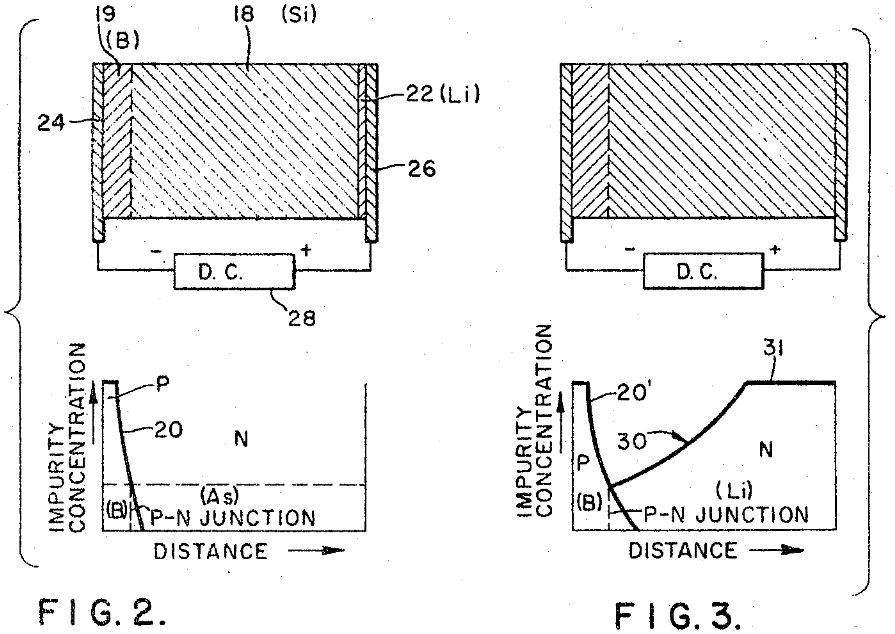
FIG. 2 is a schematic illustration of the first form of the invention, showing the conditions in an initial phase of the double-diffusion process.
FIG. 3 is a similar view showing the conditions at a terminal phase thereof.

FIGURES 2 and 3 illustrate the special double-diffusion technique of this invention. In FIGURE 2, bulk material 18 has had a thin surface layer 19 (at the left) infused inwardly of the surface by an acceptor impurity such as boron, to a depth up to about one micron, producing the desired P-on-N configuration. The curve 20 shows as ordinates the relative concentration of boron atoms, and indicates the manner in which this concentration decreases with depth, or distance, as measured from the left-hand surface. The impurity concentration at each depth is indicated as the excess of acceptor atoms over donor atoms ($Na-Nd$).

A layer 22 of donor material such as lithium, for example, is applied to the opposite (right-hand) face of the bulk material, the temperature is adjusted to about 200° C., and an electric field is applied across the major cell faces as by tungsten electrodes 24 and 26 connected to a DC voltage source 28. At this temperature and with a suitable field-producing voltage, lithium atoms will rapidly diffuse inwardly (to the left) in bulk material 18, the concentration curve at completion being indicated by 30 (FIGURE 3). Horizontal region 31 is the result of ionic drift, and the balance of curve 30 is the result of ionic diffusion. The cell is then cooled, and the electrodes 24 and 26 removed, usual solar cell electrodes being then permanently applied in ways familiar to those skilled in the art.

The solar cell thus produced presents an impurity concentration gradient in both its thin (P) region and its thick (N) region, thus ensuring minority carrier drift on both sides of the P-N junction, and consequent greatly-increased resistance to degradation from nuclear bombardment. The application to an N-on-P cell is believed obvious from the foregoing.

SECOND PROCESS EMBODIMENT

Figure 4:
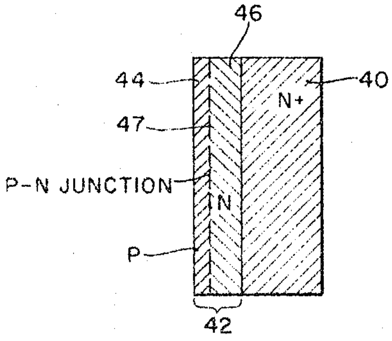
FIG. 4 is a sectional view of a solar cell indicating the application of the second (epitaxial) method of the invention.
Figure 5:
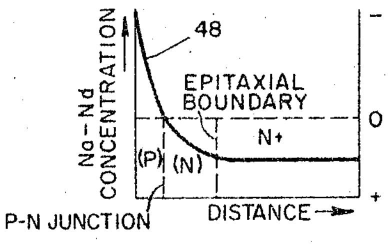
FIG. 5 is a graphical representation of the conditions of concentration gradient in the product of this second method.

The method illustrated in FIGURES 4 and 5 utilizes the technique of epitaxial growth to provide the desired concentration gradient on both sides of the junction. In this technique, a thin film is grown on a smooth semiconductor substrate by exposing the latter to a carrier gas which may (in the case of a silicon substrate) be silicon tetrachloride. Since the process has been widely described in the literature as applied to other semiconductor devices (such as transistors), it is not deemed to be necessary to repeat such details here. Reference may be made, for example, to the abbreviated description at pp. 109 and 110 of "Electronics" magazine for Sept. 29, 1961.

In FIGURE 4, a very low-resistivity slice 40 of N-type monocrystalline silicon that is 10 to 15 mils thick is used as the substrate. Its resistivity may be of the order of 0.001 ohm-centimeter, which would be wholly unsuitable for solar cells of heretofore described types. The slice is provided with a thin (.5–5 mils thick) epitaxially-grown surface layer 42 of high-resistivity N-type silicon. Boron is now conventionally diffused into this layer 42 as at 44, to a depth of up to one micron, as before; that is, by depositing the boron on the surface of epitaxial layer 42 and heating the entire device.

During the diffusion of boron into layer 42, the majority impurity in the body 40 of N-type substrate will itself diffuse into layer 42 from the opposite side, as at 46. There is thus produced the desired oppositely-directed impurity concentration gradients on both sides of P-N junction 47. Curve 48 in FIGURE 5 again illustrates the gradients in terms of the excess of acceptor over donor atoms ($Na-Nd$). Both positive and negative values are represented, the zero value corresponding to the plane of the junction itself.

In the case of epitaxial growth at 1200° C. and where arsenic has been used as the impurity atom in body 40, the impurity will diffuse into the thin film during the epitaxial growth. If a lower temperature or a different impurity is used, the temperature can be raised after the epitaxial growth has been completed, to achieve diffusion at that time. If preferred, the temperature can be adjusted so that the impurity will not diffuse into the thin film from the substrate until the boron is diffused into the front surface.

Besides its production of solar cells having relative immunity to degradation by nuclear bombardment, the method as just described has other advantages, such as the possibility of employing lower-cost (low-resistivity) silicon substrate material, higher equilibrium barrier voltage, and lower bulk series resistance in the cells so produced.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention.

I claim:

1. A photovoltaic semiconductor device for converting light energy into electrical energy possessing improved resistance to radiation damage comprising: a monocrystalline body of semiconductor material, said body comprising a bulk region doped with first donor impurity atoms whereby said bulk has an N-type conductivity characteristic, said bulk region having a major surface; a surface region formed over substantially the entire area of said major surface of said bulk region, said surface region being doped with acceptor impurity atoms to provide said surface region with a P-type conductivity characteristic; a P-N junction separating said bulk region from said surface region, said surface region being thin enough to be transparent to substantial amounts of said light energy whereby said light energy may be passed to said P-N junction; and, second donor impurity atoms diffused into said bulk region with said first donor impurity atoms for increasing resistance to radiation damage, said second donor impurity atoms comprising a concentration gradient of lithium atoms disposed in said bulk region.

2. The device of claim 1 wherein said bulk region has a relatively even distribution of said first donor impurity atoms.

3. The device of claim 1 wherein said concentration gradient of lithium atoms increases away from said junction.

References Cited

UNITED STATES PATENTS

| | | | |
|---|---|---|---|
| 2,560,792 | 7/1951 | Gibney | 148—1.5 |
| 2,725,315 | 11/1955 | Fuller | 148—1.5 |
| 2,711,379 | 6/1955 | Rothstein | 148—1.5 |
| 2,963,390 | 12/1960 | Dickson | 148—1.5 |
| 2,983,854 | 5/1961 | Pearson | 148—185 |
| 2,976,433 | 3/1961 | Rappaport et al. | 148—177 |
| 2,911,553 | 11/1959 | Damask | 148—186 |
| 3,016,313 | 1/1962 | Pell | 148—186 |
| 3,067,485 | 12/1962 | Ciccolella | 148—186 |
| 3,089,794 | 5/1963 | Marinace | 148—175 |
| 3,121,808 | 2/1964 | Kahng | 148—175 |
| 2,806,983 | 9/1957 | Hall | 148—173 XR |
| 2,780,765 | 2/1957 | Chapin | 136—89.05 XR |
| 2,908,781 | 10/1959 | McKay | 148—186 |
| 2,930,722 | 3/1960 | Ligenza | 148—189 |
| 3,131,098 | 4/1964 | Krsek | 148—175 |
| 3,196,058 | 7/1965 | Webster | 148—189 XR |
| 2,929,859 | 3/1960 | Loferski | 136—89 |
| 2,955,269 | 10/1960 | Silvey | 136—89 |
| 3,261,074 | 7/1966 | Beuzee | 136—89 |

OTHER REFERENCES

"Manufacture of Transistors for Use in Microminiature Circuitry," by L. Maissel and Schwartz, vol. 3, No. 12, May 1961, IBM Technical Disclosure.

HYLAND BIZOT, Primary Examiner

U.S. Cl. X.R.

148—186